United States Patent [19]

Hatakeyama et al.

[11] Patent Number: 5,750,309
[45] Date of Patent: May 12, 1998

[54] CHEMICALLY AMPLIFIED POSITIVE RESIST COMPOSITION

[75] Inventors: Jun Hatakeyama; Shigehiro Nagura; Kiyoshi Motomi; Takeshi Nagata; Toshinobu Ishihara, all of Nakakubiki-gun, Japan

[73] Assignee: Shin-Etsu Chemical Co., Ltd., Tokyo, Japan

[21] Appl. No.: 684,481

[22] Filed: Jul. 19, 1996

[30] Foreign Application Priority Data

Jul. 20, 1995 [JP] Japan .................. 7-206684

[51] Int. Cl.⁶ .................................................. G03F 7/004
[52] U.S. Cl. ........................... 430/170; 430/270.1; 430/905; 430/910
[58] Field of Search .................. 430/270.1, 170, 430/905, 910

[56] References Cited

U.S. PATENT DOCUMENTS

| | | | |
|---|---|---|---|
| 5,314,931 | 5/1994 | Yamada et al. | 430/270.1 |
| 5,356,753 | 10/1994 | Yamada et al. | 430/270.1 |
| 5,468,589 | 11/1995 | Urano et al. | 430/270.1 |
| 5,547,812 | 8/1996 | Collins et al. | 430/270.1 |
| 5,558,971 | 9/1996 | Urano et al. | 430/270.1 |
| 5,624,787 | 4/1997 | Watanabe et al. | 430/270.1 |
| 5,627,006 | 5/1997 | Urano et al. | 430/270.1 |
| 5,629,134 | 5/1997 | Oikawa et al. | 430/270.1 |

*Primary Examiner*—John S. Chu
*Attorney, Agent, or Firm*—Millen, White, Zelano, & Branigan P.C.

[57] ABSTRACT

In a chemical amplification positive resist composition comprising an organic solvent, a resin and a photoacid generator, at least two polymers having different molecular weights selected from polyhydroxystyrenes having some hydroxyl groups protected with acid labile groups are used. Among the polymers, a high molecular weight polymer has a molecular weight dispersity (Mw1/Mn1) of up to 1.5, and a low molecular weight polymer has a dispersity (Mw2/Mn2) of up to 5.0. The weight average molecular weight ratio Mw1/Mw2 is between 1.5/1 and 10.0/1. The resist composition is highly sensitive to actinic radiation, has improved sensitivity and resolution, and is suitable for use in a fine patterning technique and commercially acceptable.

20 Claims, No Drawings

CHEMICALLY AMPLIFIED POSITIVE RESIST COMPOSITION

BACKGROUND OF THE INVENTION

1. Field of the Invention

This invention relates to a chemically amplified, positive resist composition which is highly sensitive to actinic radiation such as deep-UV, electron beam and X-ray, can be developed with alkaline aqueous solution to form a pattern, and is thus suitable for use in a fine patterning technique.

2. Prior Art

As the LSI technology tends toward higher integration and higher speed, further refinement of pattern rules is required. The current patterning technology mostly relies on light exposure which is now approaching to the essential limit of resolution which is dictated by the wavelength of a light source. It is generally recognized that in light exposure using g-line (wavelength 436 nm) or i-line (wave-length 365 nm) as a light source, a pattern rule of about 0.5 μm is the limit. For LSIs fabricated by such light exposure technique, a degree of integration equivalent to 16 mega-bit DRAM is the limit. At present, LSIs fabricated in the laboratory have reached this stage. It is urgently required to develop a finer patterning technique.

Under such circumstances, deep-ultraviolet lithography is regarded promising as the next generation of fine patterning technology. The deep-UV lithography is capable of working on the order of 0.3 μm or less. If a less light absorbing resist is used, it is possible to form a pattern having a side wall nearly perpendicular to the substrate.

Chemically amplified, positive working resist materials were recently developed using acid catalysts as disclosed in JP-B 27660/1990, JP-A 27829/1988, U.S. Pat. No. 4,491,628 and 5,310,619. While a high illuminance KrF excimer laser can be utilized as a deep-UV light source, these materials have high sensitivity, resolution and dry etching resistance and are promising as resist materials especially suited for deep-UV lithography.

The chemically amplified, positive resist materials being known include those of the two-component system comprising an alkali-soluble organic polymer and a photoacid generator and those of the three-component system comprising an alkali-soluble organic polymer, a dissolution inhibitor having an acid labile group, and a photoacid generator. There is a desire to further improve the sensitivity and resolution of these materials.

SUMMARY OF THE INVENTION

Therefore, an object of the invention is to provide a chemically amplified, positive resist composition having high sensitivity and resolution.

The present invention generally pertains to a chemically amplified, positive resist composition comprising an organic solvent, a resin, a photoacid generator, and optionally a dissolution inhibitor. The resin is at least two polymers having different molecular weights selected from polyhydroxystyrenes having some hydroxyl groups protected of the following general formula:

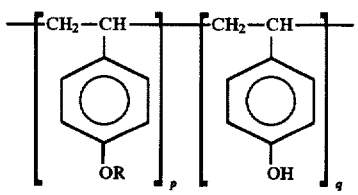
(1)

wherein R is an acid labile group and letters p and q are such numbers that p/(p+q) is at least 0.05. Among the at least two polymers having different molecular weights are a high molecular weight polymer having a molecular weight dispersity (Mw/Mn) of up to 1.5, and remaining low molecular weight polymer or polymers having a molecular weight dispersity (Mw/Mn) of up to 5.0. The ratio of Mw1/Mw2 is at least 1.5/1 wherein the high molecular weight polymer has a weight average molecular weight Mw1, and the remaining low molecular weight polymer or polymers have a weight average molecular weight Mw2. Then the resulting chemically amplified, positive resist composition forms a resist film which has a high contrast in dissolution rate, especially an increased dissolution rate after exposure, and a high resolution and is fully effective in fine processing, especially deep-UV lithography.

Note that the dispersity used herein is a molecular weight distribution defined as the weight average molecular weight divided by the number average molecular weight, i.e., Mw/Mn. Also the terms high and low molecular weights are used in a relative sense that one is higher than the other.

More particularly, according to the invention, at least two polymers selected from polyhydroxystyrenes with partially protected hydroxyl groups of formula (1) and having the above-defined dispersity and weight average molecular weight ratio are used. The mutual compatibility between a high molecular weight polymer and a low molecular weight polymer enhances the dispersion therein of the photoacid generator and the dissolution inhibitor to increase the density of the matrix, achieving micro-scopically uniform and controlled migration of the acid generated upon exposure. This, in turn, improves resolution and rectangularity after patterning and minimizes micro-scum left on the substrate surface and micro-roughness of the pattern edge.

Accordingly, the present invention provides a chemically amplified, positive resist composition comprising at least two polymers having different molecular weights selected from polyhydroxystyrenes having some hydroxyl groups protected of the general formula (1), wherein a high molecular weight polymer has a dispersity of up to 1.5, the remaining low molecular weight polymer or polymers have a dispersity of up to 5.0, and the ratio of the weight average molecular weight Mw1 of the high molecular weight polymer to the weight average molecular weight Mw2 of the remaining low molecular weight polymer or polymers is at least 1.5/1.

The present invention also provides a chemically amplified, positive resist composition comprising (A) an organic solvent, (B) the above-defined polymers having different molecular weight, (C) a dissolution inhibitor, and (D) a photoacid generator. The present invention also provides a chemically amplified, positive resist composition comprising (A) an organic solvent, (B) the above-defined polymers having different molecular weight, and (D) a photoacid generator.

DETAILED DESCRIPTION OF THE INVENTION

In the chemical amplification type positive working resist composition of the present invention, at least two polymers having different molecular weights selected from polyhydroxystyrenes of the general formula (1) wherein some of the hydroxyl groups are protected with acid labile groups are used. Among the at least two polymers, a high molecular weight polymer has a molecular weight dispersity (Mw/Mn) of up to 1.5, and the remaining low molecular weight polymer or polymers have a molecular weight dispersity (Mw/Mn) of up to 5.0. The ratio of the weight average molecular weight Mw1 of the high molecular weight polymer to the weight average molecular weight Mw2 of the remaining low molecular weight polymer or polymers, that is, Mw1/Mw2 is at least 1.5/1.

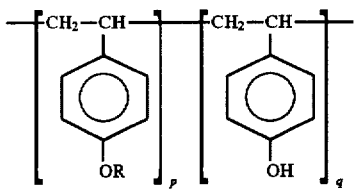

In formula (1), R is an acid labile group. The polymer of formula (1) is slightly soluble in alkali or insoluble in alkali, although it becomes soluble in alkali when the labile group is eliminated therefrom.

The acid labile group is preferably selected from the group consisting of linear or branched alkyl groups having 1 to 8 carbon atoms, alkoxyalkyl groups having the following general formula (2), alkoxycarbonyl or alkoxycarbonylalkyl groups having the general formula (3), tetrahydropyranyl group, tetrahydrofuranyl group, trialkylsilyl groups, and β-ketoalkyl groups.

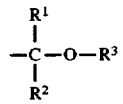

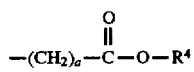

In formulae (2) and (3), $R^1$ and $R^2$ are independently selected from hydrogen atom and linear or branched alkyl groups having 1 to 6 carbon atoms. $R^3$ is a linear, branched or cyclic alkyl group having 1 to 10 carbon atoms. $R^4$ is a linear or branched alkyl group having 1 to 6 carbon atoms. Letter a is 0 or 1.

Examples of the linear or branched alkyl groups include methyl, ethyl, propyl, isopropyl, n-butyl, iso-butyl and tert-butyl groups. Examples of the cyclic alkyl groups include cyclohexyl group.

As the acid labile group represented by formula (2), methoxyethyl, ethoxyethyl, n-propoxyethyl, isopropoxyethyl, n-butoxyethyl, iso-butoxyethyl, tert-butoxyethyl cyclohexyloxyethyl, methoxypropyl, ethoxypropyl, ethoxyisopropyl, ethoxyisobutyl, 1-methoxy-1-methyl-ethyl, and 1-ethoxy-1-methyl-ethyl groups are exemplified.

As the acid labile group represented by formula (3), tert-butoxycarbonyl and tert-butoxycarbonylmethyl groups are exemplified.

The trialkylsilyl group is preferably one in which each alkyl group has 1 to 6 carbon atoms. The alkyl groups are identical or different. Examples of the trialkylsilyl groups include trimethylsilyl and tert-butyldimethylsilyl groups.

The β-ketoalkyl group is preferably one in which the alkyl group has 1 to 6 carbon atoms.

Among the acid labile group, ethoxyethyl group, ethoxyisopropyl group, ethoxyisobutyl group, n-propoxyethyl group, iso-propoxyethyl group, n-butoxyethyl group, iso-butoxyethyl group, tert-butoxyethyl group, tert-butoxycarbonyl group, and tert-butoxycarbonylmethyl group are preferred, although not limited thereto.

Letters p and q are such numbers that p/(p+q) representing a degree of protective group substitution is at least 0.05, preferably between 0.1 and 0.5. Within this range, hydroxyl groups in a molecule are replaced by acid labile groups. With p/(p+q)<0.05, a pattern profile is unsatisfactory.

The polyhydroxystyrenes of formula (1) should preferably have a dispersity (Mw/Mn) of up to 1.5, especially 1.0 to 1.4.

In the practice of the invention, at least two polymers having different molecular weights are selected from polyhydroxystyrenes of formula (1). Among these polymers, a high molecular weight polymer has a dispersity of up to 1.5, and the remaining low molecular weight polymer or polymers as a whole have a dispersity of up to 5.0. The ratio of the weight average molecular weight Mw1 of the high molecular weight polymer to the weight average molecular weight Mw2 of the remaining low molecular weight polymer or polymers as a whole, that is, Mw1/Mw2 is at least 1.5/1, preferably between 2.0/1 and 10.0/1. With Mw1/Mw2<1.5, the advantages of improved resolution and minimized edge roughness are lost.

Preferably, the weight average molecular weight Mw1 of the high molecular weight polymer is 6,000 to 40,000, more preferably 6,000 to 20,000. The weight average molecular weight Mw2 of the remaining low molecular weight polymer(s) is preferably 500 to less than 6,000, more preferably 600 to less than 6,000. Polymers with a weight average molecular weight outside the above-defined ranges would adversely affect the pattern profile and sensitivity.

In a mixture of polyhydroxystyrenes, 100 parts by weight of the high molecular weight polymer is preferably blended with about 3 to about 1,000 parts, especially about 5 to about 200 parts by weight of the low molecular weight polymer. Resolution would be insufficient with less than 3 parts of the low molecular weight polymer whereas more than 1,000 parts of the low molecular weight polymer would result in thinning of pattern film, low resolution and poor heat resistance.

The resist composition of the invention may be formulated as a chemically amplified positive resist composition of the known two- or three-component system. The above-said mixture of polyhydroxystyrenes may be blended in a resist composition comprising an organic solvent, a photoacid generator, and optionally a dissolution inhibitor.

Examples of the organic solvent include ketones such as cyclohexanone and methyl-2-n-amylketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate and ethyl 3-ethoxypropionate, alone or in admixture of two or more. The preferred solvents are diethylene glycol dimethyl ether and 1-ethoxy-2-propanol because the acid generator of the resist composition is most soluble therein. The amount of the organic solvent used is generally about 200 to 1,000 parts, preferably about 400 to 800 parts by weight per 100 parts by the total weight of the polymers having different molecular weights. Compositions with less than 200 parts of the solvent would somewhat lack mutual miscibility of the components and film formability. Compositions with more than 1,000 parts of the solvent would form too thin films which are unacceptable in practice.

The photoacid generator may be selected from well-known ones including onium salts, sulfonates and diazosulfones. Preferred are onium salts, for example, triphenylsulfonium triflates and triphenylsulfonium tosylates. The amount of the acid generator used is generally about 1 to 20 parts, preferably about 2 to 10 parts by weight per 100 parts by the total weight of the polymers having different molecular weights.

If desired, a dissolution inhibitor is added to the resist composition of the invention. The dissolution inhibitor used herein should preferably have at least acid labile group in a molecule. It may be selected from well-known dissolution inhibitors, for example, bisphenol A derivatives and phenolphthalein derivatives, with those wherein the hydrogen of a hydroxyl group is replaced by a tert-butoxycarbonyl group being preferred. The amount of the dissolution inhibitor used is generally about 5 to 50 parts, preferably about 10 to 30 parts by weight per 100 parts by the total weight of the polymers having different molecular weights.

The resist composition of the invention may further contain various additives, for example, a nitrogenous compound for improving environmental stability, a surface-active agent for facilitating coating, and a light-absorbing agent for reducing irregular reflection from the substrate, all in conventional amounts.

Typical nitrogenous compounds are amine and amide compounds having a boiling point of 150° C. or higher. Examples include aniline, N-methylaniline, N,N-dimethylaniline, o-toluidine, m-toluidine, p-toluidine, 2,4-lutidine, quinoline, isoquinoline, formamide, N-methylformamide, N,N-dimethylformamide, acetamide, N-methylacetamide, N,N-dimethylacetamide, 2-pyrrolidone, N-methylpyrrolidone imidazole, α-picoline, β-picoline, γ-picoline, o-aminobenzoic acid, m-aminobenzoic acid, p-aminobenzoic acid, 1,2-phenylenediamine, 1,3-phenylene-diamine, 1,4-phenylenediamine, 2-quinolinecarboxylic acid, 2-amino-4-nitrophenol, and triazines such as 2-(p-chloro-phenyl)-4,6-trichloromethyl-s-triazine. Preferred among others are pyrrolidone, N-methylpyrrolidone, o-, m- and p-aminobenzoic acid, 1,2-, 1,3- and 1,4-phenylenediamine.

Examples of the surfactant include perfluoroalkylpolyoxyethylene ethanols, fluorinated alkyl esters, perfluoroalkylamine oxides, and perfluoroalkyl EO addition products. Examples of the light-absorbing agent include diaryl sulfoxides, diaryl sulfones, 9,10-dimethylanthracene, and 9-fluorenone.

Any well-known lithography may be used to form a resist pattern from a positive resist composition of the invention. For example, the resist composition is spin coated onto a silicon wafer, prebaked at 80° to 120° C. for 30 to 200 seconds to form a resist film of 0.5 to 2.0 μm thick, exposed to actinic radiation such as deep-UV, electron beam, and X-ray, and baked at 70° to 120° C. for 30 to 200 seconds (post-exposure baking=PEB), and developed with an aqueous base solution. The resist composition of the invention is especially suitable for fine patterning with deep-UV radiation of 254 to 193 nm and electron beams.

There has been described a chemically amplified, positive resist composition which is highly sensitive to actinic radiation such as deep-ultraviolet radiation, electron beam and X-ray, especially KrF excimer laser light, has improved sensitivity, resolution and plasma etching resistance. The resulting resist pattern is fully resistant to heat. This high resolution resist composition is suitable for use in a fine patterning technique and commercially acceptable.

EXAMPLE

Examples of the present invention are given below by way of illustration and not by way of limitation. All parts are by weight.

Examples 1–16 and Comparative Examples 1–22

Liquid resist compositions were prepared by dissolving a polymer, a photoacid generator, and a dissolution inhibitor in a solvent in accordance with the formulation shown in Tables 1 to 3. Each of the compositions was passed through a 0.2-μm Teflon® filter.

The polymers used were polyhydroxystyrenes, designated Polymers 1 to 4, in which some hydroxyl groups are protected with tert-butoxycarbonyl, tert-butoxy, tetrahydropyranyl, and ethoxyethyl groups, respectively.

The photoacid generators used were PAG1 to PAG4 shown below.

The dissolution inhibitor used was DRI shown below.

The solvents used were 1-ethoxy-2-propanol (EIPA) and diethylene glycol dimethyl ether (DGRL).

Each liquid resist composition was then spin coated onto a silicon wafer to form a coating of 0.8 μm thick. With the silicon wafer rested on a hot plate at 100° C., the coating was pre-baked for 90 seconds. The film was exposed to a pattern of light by means of an excimer laser stepper model NSR-2005EX8A (manufactured by Nikon K.K., numerical aperture NA=0.5), baked at 90° C. for 60 seconds, and developed with an aqueous solution of 2.38% tetramethylammonium hydroxide, obtaining a positive pattern.

The resulting resist pattern was evaluated as follows. First, a sensitivity (Eth value) was determined. Provided that the exposure quantity with which the top and bottom of a 0.35-μm line-and-space pattern were resolved at 1:1 was the optimum exposure (sensitivity Eop), the minimum line width of a line-and-space pattern which was recognized separate at this exposure was the resolution of a test resist. The configuration of the resist pattern resolved was observed under a scanning electron microscope. The edge roughness of a 0.25 μm line-and-space pattern was also observed under a scanning electron microscope S-7280H manufactured by HITACHI K.K.

The results are shown in Tables 1 to 3.

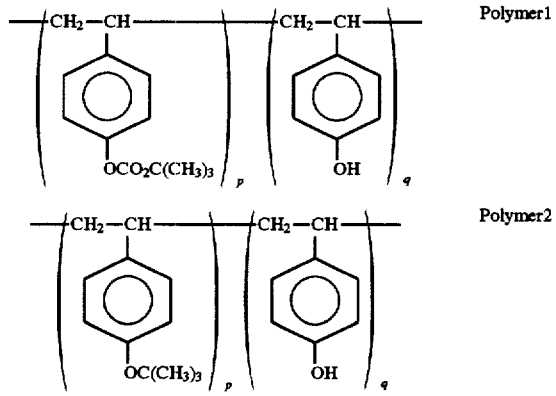

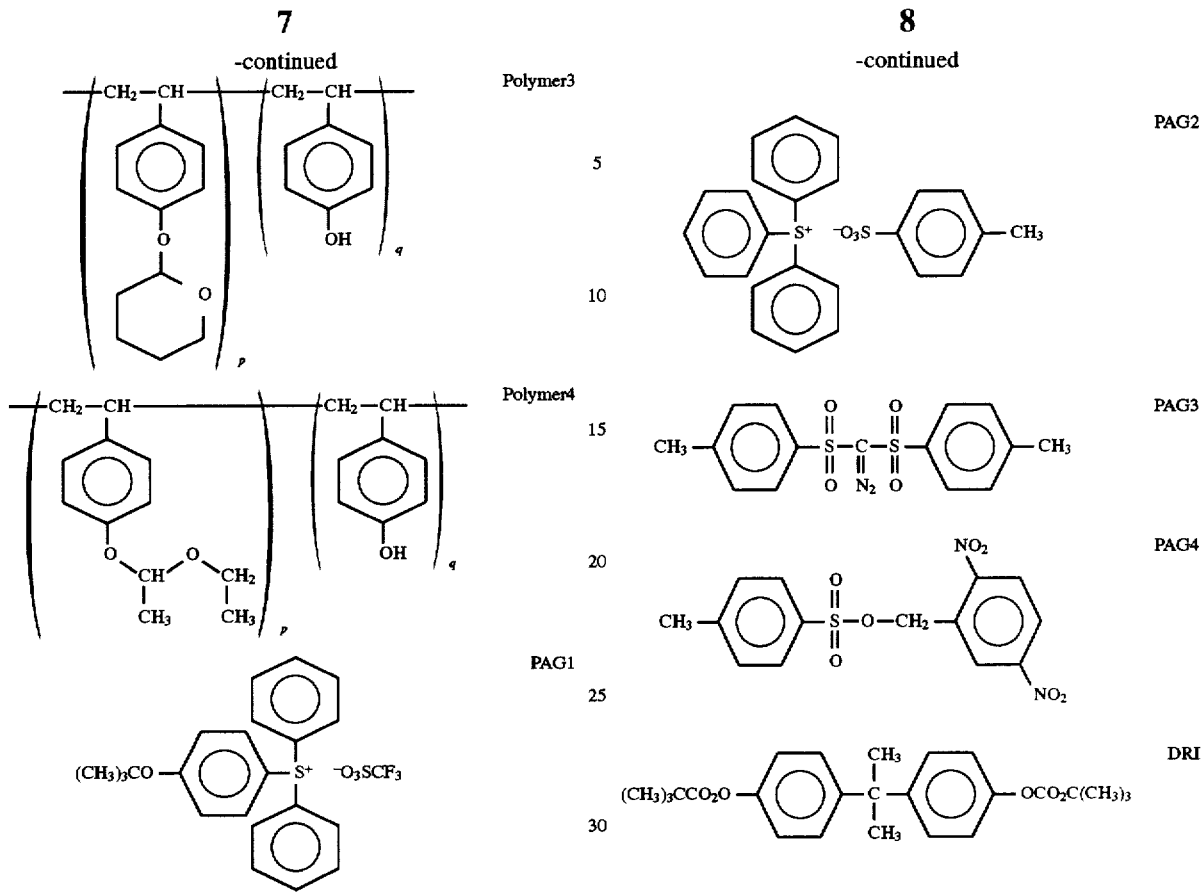

TABLE 1

| | | Resist composition, pbw in parentheses | | | | | | | | | |
|---|---|---|---|---|---|---|---|---|---|---|---|
| | | High molecular weight polymer | | | Low molecular weight polymer | | | Photoacid | Dissolution | | Resolution | Edge roughness |
| Example | Type | Mw | p/(p + q) | Mw/Mn | Mw | p/(p + q) | Mw/Mn | generator | inhibitor | Solvent | (μm) | (nm) |
| E1 | Polymer 1 | 11000 (45) | 0.12 | 1.1 | 5000 (35) | 0.16 | 1.1 | PAG1 (5) | DRI (14) | EIPA (300) | 0.20 | 4 |
| E2 | Polymer 1 | 11000 (60) | 0.12 | 1.1 | 3000 (20) | 0.18 | 1.1 | PAG1 (5) | DRI (14) | EIPA (300) | 0.22 | 5 |
| E3 | Polymer 1 | 11000 (40) | 0.20 | 1.1 | 5000 (40) | 0.10 | 1.1 | PAG1 (5) | DRI (14) | EIPA (300) | 0.22 | 5 |
| E4 | Polymer 1 | 11000 (40) | 0.09 | 1.1 | 5000 (40) | 0.25 | 1.1 | PAG1 (5) | DRI (14) | EIPA (300) | 0.22 | 5 |
| E5 | Polymer 1 | 20000 (45) | 0.10 | 1.1 | 10000 (35) | 0.12 | 1.1 | PAG1 (5) | DRI (14) | EIPA (300) | 0.24 | 8 |
| E6 | Polymer 1 | 20000 (60) | 0.10 | 1.1 | 5000 (20) | 0.16 | 1.1 | PAG1 (5) | DRI (14) | EIPA (300) | 0.24 | 7 |
| E7 | Polymer 1 | 11000 (45) | 0.12 | 1.1 | 5000 (35) | 0.16 | 1.1 | PAG2 (5) | DRI (14) | EIPA (300) | 0.22 | 5 |
| E8 | Polymer 1 | 11000 (45) | 0.12 | 1.1 | 5000 (35) | 0.16 | 1.1 | PAG3 (5) | DRI (14) | EIPA (300) | 0.22 | 5 |
| E9 | Polymer 1 | 11000 (45) | 0.12 | 1.1 | 5000 (35) | 0.16 | 1.1 | PAG4 (5) | DRI (14) | EIPA (300) | 0.22 | 5 |
| E10 | Polymer 2 | 11000 (45) | 0.12 | 1.1 | 5000 (35) | 0.16 | 1.1 | PAG1 (5) | DRI (14) | EIPA (300) | 0.24 | 6 |
| E11 | Polymer 3 | 11000 (45) | 0.12 | 1.1 | 5000 (35) | 0.16 | 1.1 | PAG1 (5) | DRI (14) | EIPIA (300) | 0.24 | 6 |
| E12 | Polymer 1 | 11000 (52) | 0.18 | 1.1 | 5000 (42) | 0.25 | 1.1 | PAG1 (5) | — | EIPA (300) | 0.24 | 6 |
| E13 | Polymer 1 | 11000 (60) | 0.12 | 1.1 | 1000 (20) | 0.25 | 3.0 | PAG1 (5) | DRI (14) | EIPA (300) | 0.22 | 5 |
| E14 | Polymer 4 | 11000 (45) | 0.32 | 1.1 | 5000 (35) | 0.40 | 1.1 | PAG1 (5) | DRI (14) | EIPA (300) | 0.22 | 6 |
| E15 | Polymer 1 | 11000 (45) | 0.12 | 1.1 | | | | PAG1 (5) | DRI (14) | EIPA (300) | 0.24 | 6 |

TABLE 1-continued

| | | High molecular weight polymer | | | Low molecular weight polymer | | | Photoacid generator | Dissolution inhibitor | Solvent | Resolution (μm) | Edge roughness (nm) |
|---|---|---|---|---|---|---|---|---|---|---|---|---|
| Example | Type | Mw | p/(p+q) | Mw/Mn | Mw | p/(p+q) | Mw/Mn | | | | | |
| | Polymer 4 | | | | 5000 (35) | 0.40 | 1.1 | | | | | |
| E16 | Polymer 4 | 11000 (45) | 0.32 | 1.1 | | | | PAG1 (5) | DRI (14) | EIPA (300) | 0.22 | 5 |
| | Polymer 1 | | | | 5000 (35) | 0.16 | 1.1 | | | | | |

TABLE 2

| | | Polymer | | | Photoacid generator | Dissolution inhibitor | Solvent | Resolution (μm) | Edge roughness (nm) |
|---|---|---|---|---|---|---|---|---|---|
| Comparative Example | Type | Mw | p/(p+q) | Mw/Mn | | | | | |
| CE1 | Polymer 1 | 3000 (80) | 0.18 | 1.1 | PAG1 (5) | DRI (14) | EIPA (300) | 0.26 | 10 |
| CE2 | Polymer 1 | 5000 (80) | 0.16 | 1.1 | PAG1 (5) | DRI (14) | EIPA (300) | 0.24 | 12 |
| CE3 | Polymer 1 | 11000 (80) | 0.12 | 1.1 | PAG1 (5) | DRI (14) | EIPA (300) | 0.24 | 12 |
| CE4 | Polymer 1 | 20000 (80) | 0.10 | 1.1 | PAG1 (5) | DRI (14) | EIPA (300) | 0.26 | 24 |
| CE5 | Polymer 1 | 11000 (80) | 0.12 | 1.1 | PAG2 (5) | DRI (14) | EIPA (300) | 0.26 | 14 |
| CE6 | Polymer 1 | 11000 (80) | 0.12 | 1.1 | APG3 (5) | DRI (14) | EIPA (300) | 0.26 | 14 |
| CE7 | Polymer 1 | 11000 (80) | 0.12 | 1.1 | PAG4 (5) | DRI (14) | EIPA (300) | 0.26 | 14 |
| CE8 | Polymer 2 | 11000 (80) | 0.12 | 1.1 | PAG1 (5) | DRI (14) | EIPA (300) | 0.26 | 14 |
| CE9 | Polymer 3 | 11000 (80) | 0.12 | 1.1 | PAG1 (5) | DRI (14) | EIPA (300) | 0.26 | 13 |
| CE10 | Polymer 1 | 11000 (94) | 0.18 | 1.1 | PAG1 (5) | — | EIPA (300) | 0.26 | 15 |
| CE11 | Polymer 1 | 3000 (80) | 0.18 | 1.8 | PAG1 (5) | DRI (14) | EIPA (300) | 0.26 | 14 |
| CE12 | Polymer 1 | 5000 (80) | 0.16 | 1.8 | PAG1 (5) | DRI (14) | EIPA (300) | 0.24 | 16 |
| CE13 | Polymer 1 | 11000 (80) | 0.12 | 1.8 | PAG1 (5) | DRI (14) | DGRL (300) | 0.24 | 18 |
| CE14 | Polymer 1 | 11000 (80) | 0.10 | 1.8 | PAG1 (5) | DRI (14) | DGRL (300) | 0.26 | 30 |

TABLE 3

| | | High molecular weight polymer | | | Low molecular weight polymer | | | Photoacid generator | Dissolution inhibitor | Solvent | Resolution (μm) | Edge roughness (nm) |
|---|---|---|---|---|---|---|---|---|---|---|---|---|
| Comparative Example | Type | Mw | p/(p+q) | Mw/Mn | Mw | p/(p+q) | Mw/Mn | | | | | |
| CE15 | Polymer 1 | 11000 (45) | 0.12 | 1.8 | 5000 (35) | 0.16 | 1.8 | PAG1 (5) | DRI (14) | EIPA (300) | 0.24 | 12 |
| CE16 | Polymer 1 | 11000 (60) | 0.12 | 1.8 | 3000 (20) | 0.18 | 1.8 | PAG1 (5) | DRI (14) | EIPA (300) | 0.26 | 11 |
| CE17 | Polymer 1 | 11000 (40) | 0.20 | 1.8 | 5000 (40) | 0.10 | 1.8 | PAG1 (5) | DRI (14) | EIPA (300) | 0.24 | 14 |
| CE18 | Polymer 1 | 11000 (40) | 0.09 | 1.8 | 5000 (40) | 0.25 | 1.8 | PAG1 (5) | DRI (14) | EIPA (300) | 0.24 | 13 |
| CE19 | Polymer 1 | 20000 (60) | 0.10 | 1.8 | 10000 (20) | 0.12 | 1.8 | PAG1 (5) | DRI (14) | EIPA (300) | 0.26 | 28 |
| CE20 | Polymer 1 | 20000 (60) | 0.10 | 1.8 | 5000 (20) | 0.16 | 1.8 | PAG1 (5) | DRI (14) | EIPA (300) | 0.26 | 26 |
| CE21 | Polymer 1 | 11000 (60) | 0.12 | 1.8 | 1000 (20) | 0.25 | 3.0 | PAG1 (5) | DRI (14) | EIPA (300) | 0.26 | 13 |

TABLE 3-continued

| Compara- tive Example | Type | High molecular weight polymer | | | Low molecular weight polymer | | | Photoacid generator | Dissolution inhibitor | Solvent | Resolution (μm) | Edge roughness (nm) |
|---|---|---|---|---|---|---|---|---|---|---|---|---|
| | | Mw | p/(p+q) | Mw/Mn | Mw | p/(p+q) | Mw/Mn | | | | | |
| CE22 | Polymer 4 | 11000 (80) | 0.32 | 1.1 | — | — | — | PAG1 (5) | DRI (14) | EIPA (300) | 0.26 | 13 |

It is evident that chemically amplified positive resist compositions within the scope of the invention have high resolution and afford patterned resist films with minimized edge roughness.

Japanese Patent Application No. 206684/1995 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A chemically amplified, positive resist composition comprising (A) an organic solvent, (B) a resin, (C) a dissolution inhibitor, and (D) a photoacid generator, wherein the resin comprises at least two polyhydroxystyrene polymers having different molecular weights and some protected hydroxyl groups, and has the following general formula:

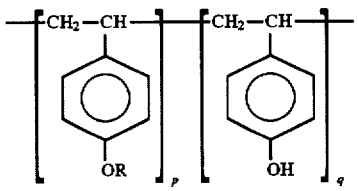

(1)

wherein R is an acid labile group and letters p and q are numbers such that p/(p+q) is at least 0.05, wherein at least one polymer is a high molecular weight polymer having a weight average molecular weight Mw1 and a molecular weight dispersity of up to 1.5, and remaining polymer or polymers are low molecular weight polymers having a weight average molecular weight Mw2 and a molecular weight dispersity of up to 5.0, and the ratio of Mw1/Mw2 is at least 1.5/1.

2. The composition of claim 1 wherein the acid labile group represented by R in formula (1) is selected from the group consisting of linear or branched alkyl groups having 1 to 8 carbon atoms, alkoxyalkyl groups having the general formula (2):

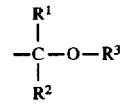

(2)

wherein R1 and R are independently selected from hydrogen atom and linear or branched alkyl groups having 1 to 6 carbon atoms, and R³ is a linear, branched or cyclic alkyl group, alkoxycarbonyl or alkoxycarbonyl alkyl groups having the general formula (3):

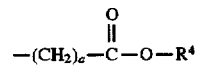

(3)

wherein R⁴ is a linear or branched alkyl group having 1 to 6 carbon atoms, and letter a is 0 or 1, tetrahydropyranyl group, tetrahydrofuranyl group, trialkylsilyl groups, and P-ketoalkyl groups.

3. A chemically amplified, positive resist composition comprising (A) an organic solvent, (B) a resin, and (D) a photoacid generator, wherein the resin comprises at least two polyhydroxystyrene polymers having different molecular weights and some protected hydroxyl groups, and has the following general formula:

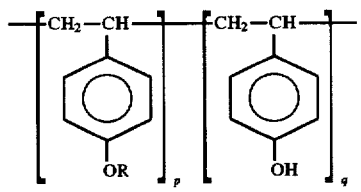

(1)

wherein R is an acid labile group and letters p and q are numbers such that p/(p+q) is at least 0.05, wherein at least one polymer is a high molecular weight polymer having a weight average molecular weight Mw1 and a molecular weight dispersity of up to 1.5, and remaining polymer or polymers are low molecular weight polymers having a weight average molecular weight Mw2 and a molecular weight dispersity of up to 5.0, and the ratio of Mw1/Mw2 is at least 1.5/1.

4. The composition of claim 3, wherein the acid labile group represented by R in formula (1) is selected from the group consisting of linear or branched alkyl groups having 1 to 8 carbon atoms, alkoxyalkyl groups having the general formula (2):

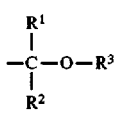

wherein R¹ and R² are independently selected from hydrogen atom and linear or branched alkyl groups having 1 to 6 carbon atoms, and R³ is a linear, branched or cyclic alkyl group, alkoxycarbonyl or alkoxycarbonyl alkyl groups having the general formula (3):

wherein $R^4$ is a linear or branched alkyl group having 1 to 6 carbo atoms, and letter a is 0 or 1, tetrahydropyranyl group, tetrahydrofuranyl group, trialkylsilyl groups, and β-ketoalkyl groups.

5. The chemically amplified, positive resist composition of claim 3, wherein the linear or branched alkyl groups are methyl, ethyl, propyl, isopropyl, n-butyl, iso-butyl or tert-butyl.

6. The chemically amplified, positive resist composition of claim 3, wherein the cyclic alkyl group is cyclohexyl.

7. The chemically amplified, positive resist composition of claim 3, wherein R is methoxyethyl, ethoxyethyl, n-propoxyethyl, iso-propoxyethyl, n-butoxyethyl, iso-butoxyethyl, tert-butoxyethyl cyclohexyloxyethyl, methoxypropyl, ethoxypropyl, ethoxyisopropyl, ethoxyisobutyl, 1-methoxy-1-methyl-ethyl, or 1-ethoxy-1-methyl-ethyl.

8. The chemically amplified, positive resist composition of claim 3, wherein R is tert-butoxycarbonyl or tert-butoxycarbonyl methyl.

9. The chemically amplified, positive resist composition of claim 3, wherein R is a tri-$C_{1-6}$-alkylsilyl group, in which the alkyl groups can be identical or different.

10. The chemically amplified, positive resist composition of claim 3, wherein R is trimethylsilyl or tert-butyldimethylsilyl.

11. The chemically amplified, positive resist composition of claim 3, wherein R is ethoxyethyl, ethoxyisopropyl, ethoxyisobutyl, n-propoxyethyl, iso-propoxyethyl, n-butoxyethyl, iso-butoxyethyl, tert-butoxyethyl, tert-butoxycarbonyl or tert-butoxycarabonylmethyl.

12. The chemically amplified, positive resist composition of claim 3, wherein p/(p+q) is 0.1 to 0.5.

13. The chemically amplified, positive resist composition of claim 3, wherein the polyhydroxystyrenes of formula (1) have a dispersity of 1.0 to 1.4.

14. The chemically amplified, positive resist composition of claim 3, wherein Mw1/Mw2 is 2.0/1 to 10.0/1.

15. The chemically amplified, positive resist composition of claim 3, wherein Mw1 is 6,000 to 40,000.

16. The chemically amplified, positive resist composition of claim 3, wherein Mw2 is 500 to less than 6,000.

17. The chemically amplified, positive resist composition of claim 3, wherein 3 to 1,000 parts by weight of the low molecular weight polymer are blended with 100 parts of the high molecular weight polymer.

18. The chemically amplified, positive resist composition of claim 3, wherein the organic solvent is a ketone, an alcohol, an ether, an ester, or a mixture thereof.

19. The chemically amplified, positive resist composition of claim 3, wherein the organic solvent is cyclohexanone, methyl-2-n-amylketone, 3-methoxybutanol, 3-methyl-3-methoxybutanol, 1-methoxy-2-propanol, 1-ethoxy-2-propanol, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl lactate, ethyl pyruvate, butyl acetate, methyl 3-methoxypropionate or ethyl 3-ethoxypropionate.

20. The chemically amplified, positive resist composition of claim 3, wherein 1–20 parts by weight per 100 parts of total polymer of an acid generator which is an onium salt, sulfonate or diazosulfone is used.

* * * * *